United States Patent [19]

Matsumoto

[11] Patent Number: 5,027,866
[45] Date of Patent: Jul. 2, 1991

[54] FORMING PRESS FOR SEMICONDUCTOR PACKAGE LEADS

[75] Inventor: Akira Matsumoto, Tokyo, Japan
[73] Assignee: Y.K.C. Co., Ltd., Japan
[21] Appl. No.: 516,172
[22] Filed: Apr. 30, 1990

[30] Foreign Application Priority Data

Jan. 25, 1990 [JP] Japan .................................. 2-13519

[51] Int. Cl.⁵ .............................................. B21F 1/00
[52] U.S. Cl. .................................................. 140/105
[58] Field of Search ................... 140/105; 72/381, 382, 72/394, 396, 400

[56] References Cited

U.S. PATENT DOCUMENTS

| 3,986,533 | 10/1976 | Woodman, Jr. | 140/105 |
| 4,515,001 | 5/1985 | Zahn | 140/105 |

FOREIGN PATENT DOCUMENTS

1118445  10/1984  U.S.S.R. .............................. 140/105

*Primary Examiner*—Robert L. Spruill
*Attorney, Agent, or Firm*—Howson and Howson

[57] ABSTRACT

A forming press for leads of semiconductor packages comprises a package supporting die and a punch. The punch comprises a package securing component movable along a first line of movement, for temporarily securing the package to the die, and a pair of lead bending components, movable, relative to the package securing component, along oblique lines of movement which converge toward the line of movement of the package securing component. The punch assembly includes a holder which supports the package securing component while allowing a limited amount of relative movement. The lead bending components are supported by the package securing component and guided in slots formed in the package securing component. Movement of the lead bending components is effected by rollers on the holder which roll on smooth surfaces at the upper ends of the lead bending components as they push downward thereon, thereby allowing the lead bending components to move in oblique paths as the holder moves in the downward direction.

9 Claims, 3 Drawing Sheets

FORMING PRESS FOR SEMICONDUCTOR PACKAGE LEADS

BRIEF SUMMARY OF THE INVENTION

This invention relates to forming presses, and in particular to a forming press for bending the electrical conducting leads extending laterally from miniature electronic packages such as semiconductor packages or similar electrical or electronic components.

Electronic components such as small and large scale integrated circuits, memories, logic arrays and the like, are conventionally housed in molded packages. These packages have outwardly extending metal leads for conducting operating power and signals to and from the internal elements. In the initial formation of such a package, the leads typically extend laterally from both sides of the package, and must be bent downward so that they can be plugged into sockets or soldered directly to printed circuit boards.

A number of machines have been devised in the past for bending the leads of electronic component packages. However, prior bending machines have a number of drawbacks. For example, in one form of bending machine, a bending punch is arranged so that it applies a bending force perpendicular to the direction in which the lead initially extends from the component package. During bending, a shear force is applied, which tends to weaken or damage the lead. In this prior bending machine, the punch also tends to move in sliding contact with the lead causing damage, for example the peeling of plating on the surface of the lead. In another type of bending machine, a bending punch is arranged to rotate about an axis in order to effect the desired deformation of the lead. The rotary bending punch is not suitable for small semiconductor packages, since a relatively large and complex mechanism is needed to effect rotation of the punch.

The principal object of this invention is to provide a forming press for leads of semiconductor packages and the like, which, in contrast with prior machines used for the same purpose, is less likely to cause damage to the leads during the bending operation. It is a further object of the invention to provide a lead forming press which is comparatively simple and inexpensive, and which is durable and reliable.

The invention addresses the above mentioned problems encountered in the use of prior art lead bending machines by a forming press structure which comprises a die for supporting a package having at least one lead extending from at least one side thereof, and a punch for holding the package and bending the lead. The punch is supported for movement along a first line of movement toward and away from the die, and comprises a package securing component movable along the first line of movement, for temporarily securing the package to the die, and at least one lead bending component, slidably supported in a guide fixed to and movable with the package securing component the package securing component, along a second line of movement, for contacting the lead and bending the lead in cooperation with the die. The lead bending component is guided so that the first and second lines of movement are oblique with respect to each other and converge in the direction of movement of the punch toward the die.

In the preferred form of the invention, suitable for use with packages having leads extending laterally from both sides, an additional lead bending component is located on the opposite side of the package securing component, for contacting and, in cooperation with the die, bending, a lead extending from the opposite side of the package. The additional lead bending component is movable relative to the securing component along a third line of movement, and the second and third lines of movement converge in the direction of movement of the punch toward the die.

When a semiconductor package or similar component is placed on the die, the punch begins to descend toward the die. The package securing component and the lead bending component move together toward the die, but are relatively movable so that, after the package securing component comes into contact with the package on the die, further descending movement of the punch causes the lead bending component of the punch to move downward and inward. Consequently, the lead bending component applies an obliquely directed bending force to the lead, resulting in a bending moment causing the lead to bend downward and inward.

After completion of the formation of the lead, the punch begins to ascend. As the punch ascends, the lead bending component retreats from the die while the package securing component remains in contact with the package. Thereafter, upon further upward movement of the punch, the package securing component separates from the package, allowing the package to be discharged from the die. Thereafter, a new package having one or more leads requiring bending is placed onto the die, and the ending operation is repeated.

Further objects, details and advantages of the invention will become apparent from the following detailed description, when read in conjunction with the drawings.

DETAILED DESCRIPTION

Figure 1:
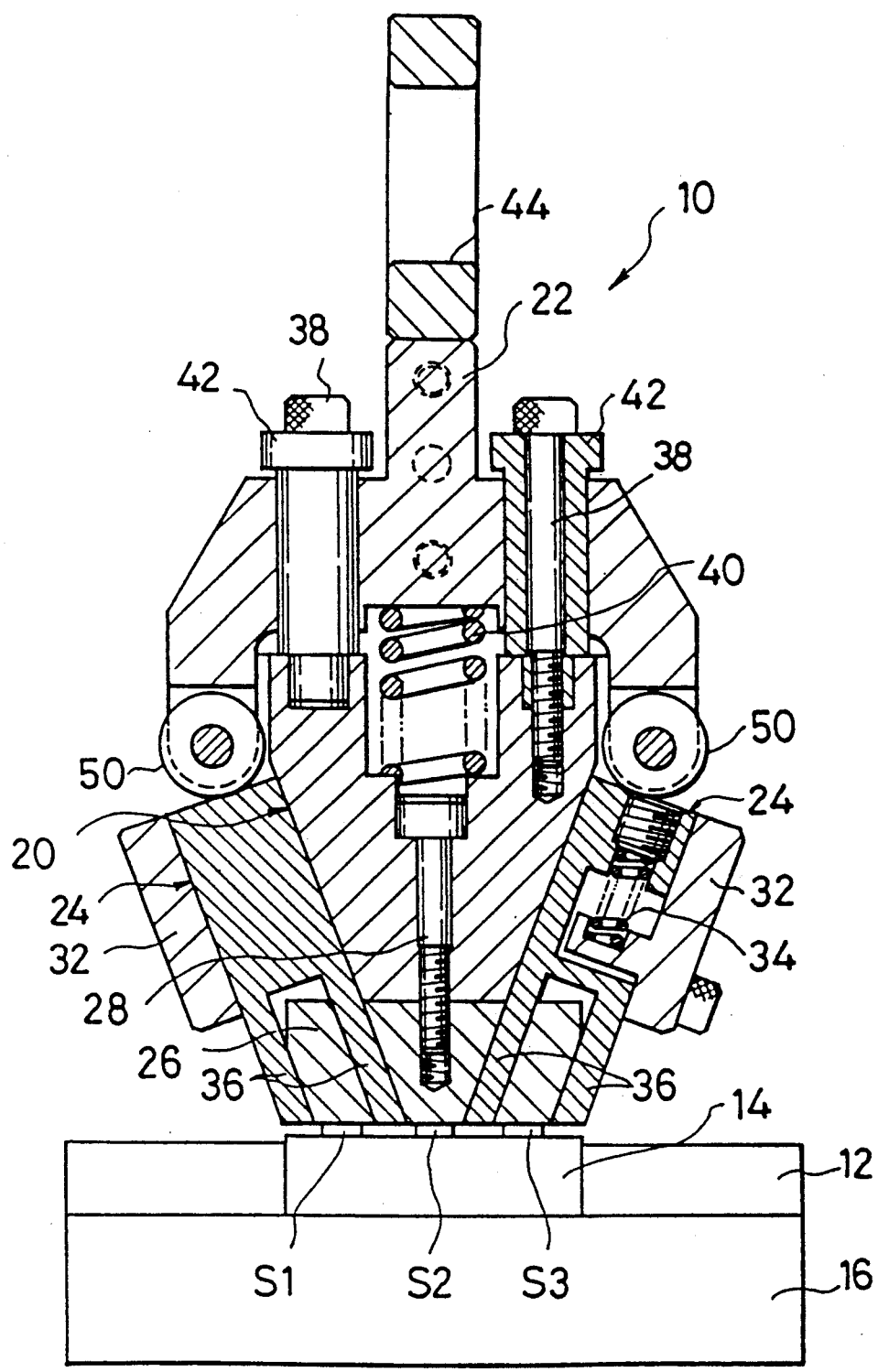
FIG. 1 is a vertical section of a preferred form of lead forming press in accordance with the invention.
Figure 3:
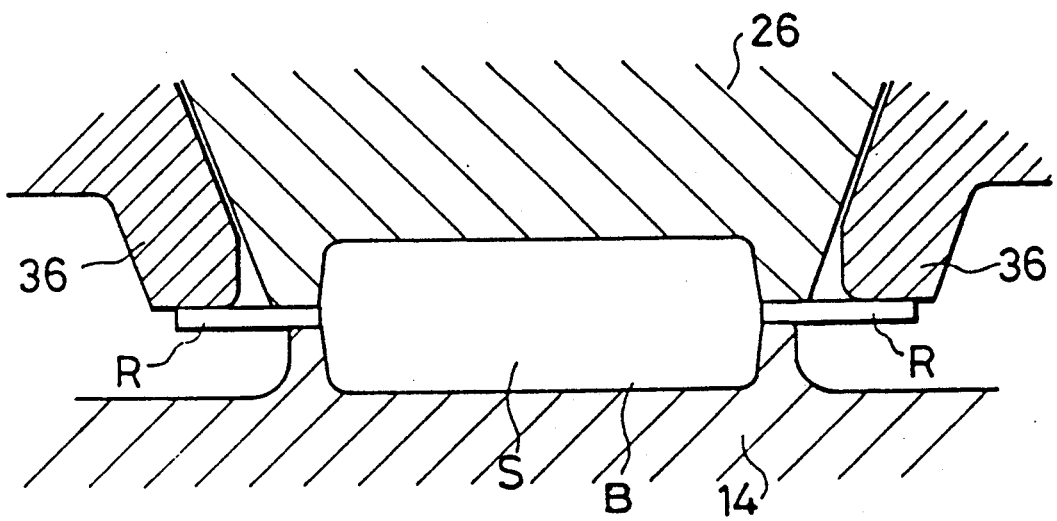
FIG. 3 is an enlarged fragmentary sectional view showing a typical semiconductor package held in a die of the press of FIGS. 1 and 2, and showing the package securing component of the punch in contact with the package, while a pair of lead bending components have not yet begun their oblique downward movement against the leads of the package.

As seen in FIG. 1, semiconductor packages $S_1$, $S_2$ and $S_3$ are held on a die 14, underneath a punch 10. The die is supported on a transfer mechanism 16 by a die holder 12. The transfer mechanism 16 moves the die to the right to effect indexing movement of the packages, and thereafter returns the die to a starting position. The semiconductor packages S are initially as shown in FIG. 3, having their leads R extending horizontally from both sides of the packages.

The die 14 may be replaced by different dies, depending on the nature of the packages to be handled and on the desired lead configuration. Preferably, the die is capable of carrying a plurality of packages simultaneously, although many of the advantages of the invention can be realized with a press in which the die is capable of holding only one package at a time.

The principal components of the punch assembly are a holder 22, a package securing component or holding punch 20, and a pair of lead bending components or bending punches 24. The package securing component 20 is guided for vertical sliding movement on a guide post 18, shown in FIG. 2. A stripper 26 is secured at the lower end of package securing component 20 by a bolt 28, which permits replacement of the stripper with another stripper designed to accommodate a different semiconductor package.

Figure 2:
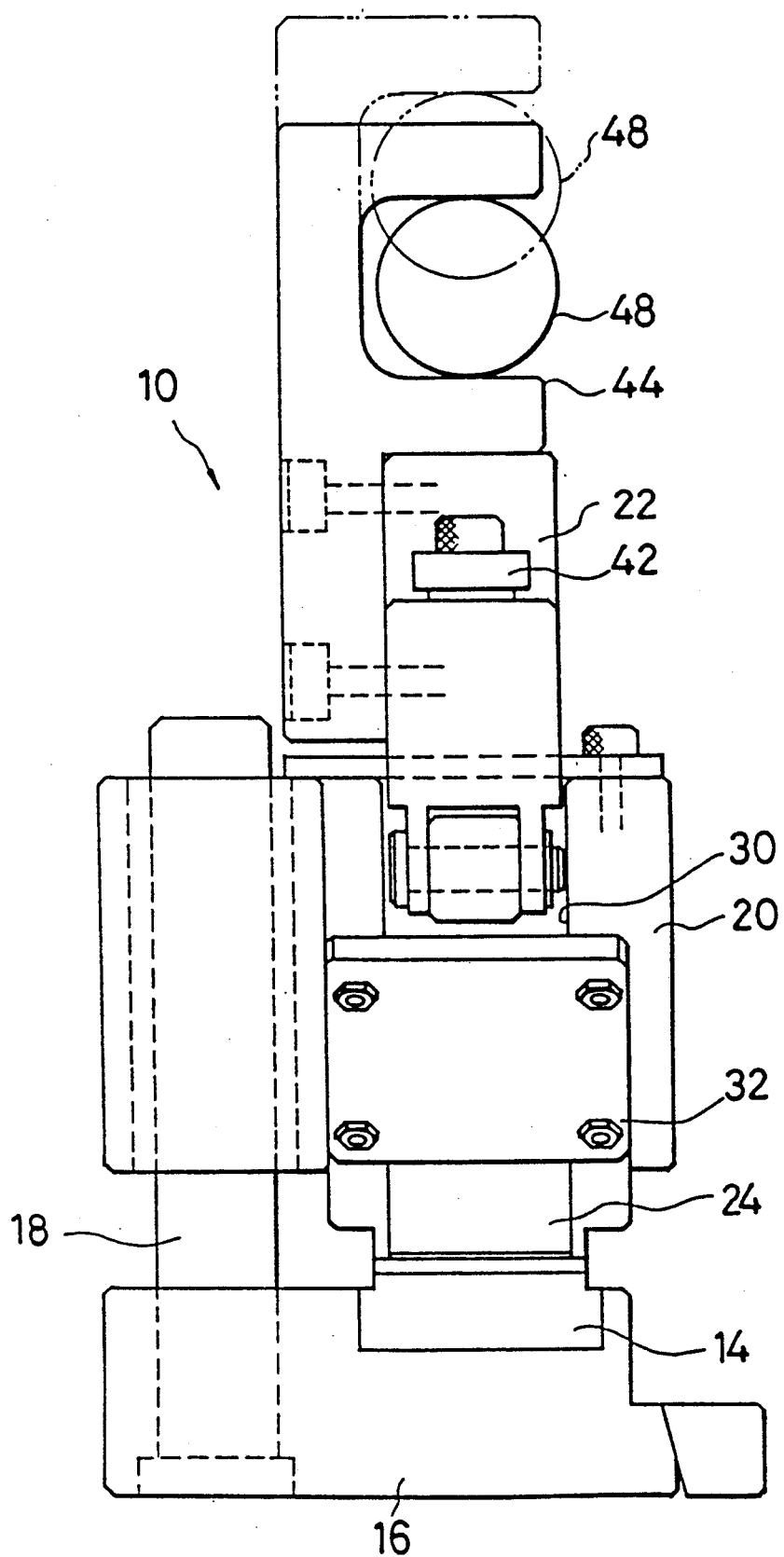
FIG. 2 is a left side elevation of the press of FIG. 1.

The lead bending components 24 are held by the package securing component 20, as shown in FIG. 1. Lead bending components 24 are slidable in oblique slots formed in component 20 so that they are constrained to move, relative to component 20, along lines which converge in the downward direction toward each other and toward the line of movement of component 20. The oblique slots have rectangular cross-sections. One such slot 30 is seen in FIG. 2. The oblique slots are defined in part by plates 32, which are removable from component 20 to allow replacement of the lead bending components 24. An internally located coil spring 34, as seen in FIG. 1, is held in compression between a flange formed on right-hand plate 32, and a plug threaded into the upper part of right-hand lead bending component 24. This spring urges the lead bending component in the retracting direction, i.e. away from die 14. The opposite lead bending component has a similar spring (not shown). In the fully retracted positions, the lower parts 36 of the lead bending components 24 are flush with the lower face of stripper 26, as shown in FIG. 3, or preferably, slightly above the lower face of the stripper. Unless an external force is applied, bending components 24 will not project beyond the face of stripper 26.

As shown in FIG. 1, the two lead bending components 24 of the punch are arranged one following the other in the direction of indexing movement of packages S. This arrangement makes it possible take advantage of the converging movements of the lead bending components, while improving efficiency by working on more than one package at a time. To this end, the lower ends of each lead bending component are formed with a plurality of lower parts capable of projecting beyond the lower face of the package securing component 20. In the embodiment illustrated in FIG. 1, each lead bending component 24 is bifurcated into two lower parts 36. Of course, it will be possible to provide more than two such lower parts on each lead bending component. The lower parts 36 are shorter as the distance from the central axis of the package securing component increases, so that the tips of parts 36 are all simultaneously flush with the lower face of stripper 26. This allows all parts 36 to operate on leads of packages $S_1$, $S_2$ and $S_3$ simultaneously.

Suspension bolts 38 are used to hold the package securing component 20 to the punch holder 22. They are threaded into component 20 as seen in FIG. 1, and allow the punch holder to slide downward relative to component 20. A compression spring 40, disposed between component 20 and holder 22 urges these elements apart. However, enlarged portions 42 formed on the upper ends of sleeves surrounding bolts 38 engage the punch holder 22, restrict relative movement of the punch holder 22 and component 20, and prevent punch holder 22 from separating from component 20.

A recess 44, provided in the upper part of the punch holder 22 and best seen in FIG. 2, accommodates a roller 48, which serves as a cam to effect up and down movement of the punch holder. The roller is preferably provided at the end of a swinging arm (not shown), or may be operated by any of a variety of forms of actuator.

Rollers 50, provided on both sides of the punch holder, as shown in FIG. 1, contact smooth upper surfaces of lead bending components 24, and move the bending components 24 downward and inward along their oblique paths when punch holder 22 moves downward relative to package securing component 20 against the force of compression spring 40. The lead bending components 24 follow oblique paths, and rollers 50 move laterally along the smooth upper surfaces of components 24, thereby insuring smooth operation of the apparatus.

In the operation of the apparatus described above, it should be understood that the semiconductor packages $S_1$, $S_2$ and $S_3$ are just three packages of a long series of packages to be operated upon by the lead bending mechanism. During operation of the mechanism, the packages are indexed to a position in which one of the packages, for example $S_2$, is centered underneath the securing component of the punch. Then, the cam roller 48 is operated, causing the punch holder 22 to descend. Package securing component 20 and lead bending components 24 move together with the punch holder. Spring 40 holds component 20 in its lowermost position relative to punch holder 22. Springs 34 hold the lead bending components 24, against rollers 50, in their uppermost positions relative to component 20 so that the lower ends of the lead bending components do not project beyond the face of stripper 26. The stripper engages semiconductor components, holding them in fixed relationship to the die 14. As shown in FIG. 3, for example, stripper 26 engages the roots of leads R, holding them firmly against the die.

If package $S_2$ is centered underneath the punch, it is held as shown in FIG. 3, while the adjacent package $S_1$ is held in a similar manner by stripper 26 underneath the space between elements 36 of the left-hand lead bending component 24. Another package $S_3$ is similarly held by stripper 26 underneath the space between elements 36 of the right-hand lead bending component.

Figure 4:
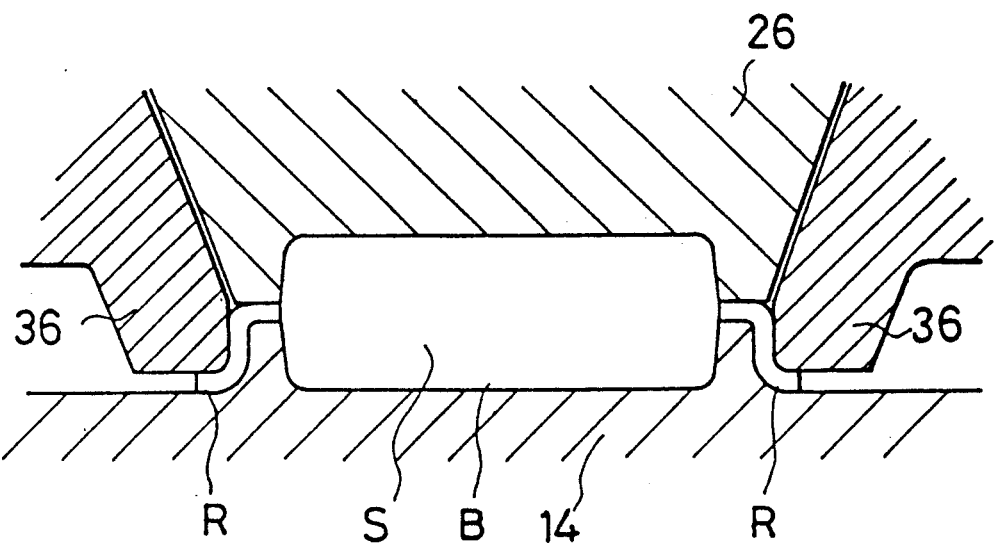
FIG. 4 is a view similar to FIG. 3, but showing the lead bending components in their fully descended condition.

As the punch holder continues to descend, the lead bending components 24 project beyond the face of the stripper 26, moving downward and inward along their oblique paths. As shown in FIG. 4, the inner elements 36 of the lead bending components come into contact with the leads R, producing a moment which acts upon the leads, forcing their free ends into contact with die 14. Assuming that the leads are to be bent into the form of the letter Z, the lead R begins to deform as soon as it is contacted by the end of the bending component 24. As the bending component advances, lead R contacts the horizontal surface of die 14, and is bent in the outward direction at a location between the root and the free end, thereby assuming the desired form in a single pass of the punch. Since the lead bending components 24 move in oblique paths, shear forces applied to the leads are negligible.

The fact that the ends of the lead-forming components are divided into two parts 36 makes it possible for the obliquely moving lead-forming components to operate on the leads of multiple packages simultaneously. In FIG. 1, for example, with the packages $S_1$, $S_2$ and $S_3$ positioned as shown, it will be appreciated that elements 36 of the left-hand lead bending component 24 operate on the left leads of packages $S_1$ and $S_2$, while elements 36 of the right-hand lead bending component operate on the right leads of packages $S_2$ and $S_3$. When the packages are initially positioned as shown, the left lead or leads of package $S_3$ will already have been bent. Operation of the punch will bend the left lead of package $S_1$, both leads of package $S_2$, and the right lead of package $S_3$. Packages $S_2$ and $S_3$ will have been completed, while only the left lead or leads of package $S_1$ will have been bent. Following the bending operation, the punch is withdrawn, and the die is indexed to the right two steps so that package $S_1$ is now underneath the space between elements 36 of the righthand lead bending component 24. Further unfinished packages are positioned in the spaces formerly occupied by packages $S_1$ and $S_2$, and, upon downward movement of the punch, the right lead or leads of package $S_1$ are formed, and leads on both sides of the center package and the left lead or leads of the leftmost package are formed.

It is, of course, possible to form each lead bending component with three or more elements similar to elements 36. If the lead bending components have three such elements, then five packages can be operated upon simultaneously. Indexing should then take place through three steps between each forming operation, rather than two steps. If the lead bending components have four or more elements similar to elements 36, indexing should take place through a number of steps corresponding to the number of lead bending elements on each lead bending component.

By virtue of the oblique movement of the lead bending components, the invention accomplishes bending of leads on semiconductor packages or the like with reduced sliding contact between the bending components and the leads, thereby reducing the likelihood of damage to the leads caused by peeling of the plating on the leads. Oblique movement of the lead bending components also makes it possible to produce relatively complicated bends, such as a bend in the form of the letter Z, in a single punching operation.

Various modifications can be made to the apparatus disclosed. For example, instead of using post 18 to guide component 20, a similar post can guide punch holder 22. Many other modifications can be made to the apparatus described without departing from the scope of the invention as defined in the following claims.

I claim:

1. A forming press for bending the leads of miniature electronic packages comprising:
   a die adapted to carry a package having a lead extending therefrom;
   a punch holder arranged to be forced along a path toward said die;
   a holding punch carried by said punch holder and arranged to project from said punch holder against the body of a package on said die to hold the package in fixed relationship to said die; and
   a lead bending punch, carried by said holding punch, and arranged to move in an oblique path converging in a downward direction toward the path of the punch holder so as to apply a downward bending force to said lead;
   said lead bending punch being arranged to protrude from said holding punch as said punch holder descends after said holding punch is positioned to hold the package in fixed relationship to the die.

2. A forming press for bending the leads of miniature electronic package comprising:
   means providing a die for supporting a package having a lead extending from at least one side thereof;
   punch means for holding the package and for bending said lead; and
   means supporting said punch means for movement along a first line of movement toward and away from said die;
   said punch means comprising package securing means, movable along said first line of movement, for temporarily securing said package to the die, lead bending means for contacting said lead and bending said lead in cooperation with said die and guide means fixed to and movable with said package securing means for slidably supporting said lead bending means and constraining said lead bending means for movement along a second line of movement;
   wherein said first and second lines of movement are oblique with respect to each other and converge in the direction of movement of said punch means toward said die.

3. A forming press according to claim 2 in which said lead bending means is located on one side of the package securing means, and comprising additional lead bending means, located on the opposite side of the package securing means, for contacting and, in cooperation with said die, bending, a lead extending from the opposite side of said package, said additional lead bending means being movable relative to said securing means along a third line of movement, and said second and third lines of movement converging in the direction of movement of said punch means toward said die.

4. A forming press according to claim 2 in which said guide means comprises a through passage in said package securing means, and the lead bending means is guided by said through passage.

5. A forming press according to claim 2 in which the punch means comprises a holder, and having means for mounting said package securing means on said holder and permitting a limited amount of relative movement of said holder and said package securing means, and spring means urging said package securing means toward a limit of relative movement of said package securing means and said holder.

6. A forming press according to claim 2 in which the punch means comprises a holder, and having means for mounting said package securing means on said holder and permitting a limited amount of relative movement of said holder and said package securing means, and spring means urging said package securing means toward and limit of relative movement of said package securing means and said holder.

7. A forming press according to claim 2 in which the punch means comprises a holder, and having means for mounting said package securing means on said holder and permitting a limited amount of relative movement of said holder and said package securing means, first spring means urging said package securing means toward a limit of relative movement of said package securing means and said holder, and second spring means for urging said lead bending means in a retracting direction away from the die.

8. A forming press according to claim 2 in which the punch means comprises a holder, and having means for mounting said package securing means on said holder and permitting a limited amount of relative movement of said holder and said package securing means, and first spring means urging said package securing means toward a limit of relative movement of said package securing means and said holder, in which the lead bending means has one end adapted for contact with the lead of a package, and an opposite end, in which the holder includes roller means for contacting said opposite end of the lead bending means, and having second spring means for urging said lead bending means in a retracting direction away from the die and maintaining said opposite end of the lead bending means in contact with said roller means.

9. A forming press according to claim 2 in which the punch means comprises a holder, and having means for mounting said package securing means on said holder and permitting a limited amount of relative movement of said holder and said package securing means, and first spring means urging said package securing means toward a limit of relative movement of said package securing means and said holder, in which the lead bending means has one end adapted for contact with the lead of a package, and an opposite end in the form of a smooth face, in which the holder includes roller means for contacting said smooth face of the lead bending means, and having second spring means for urging said lead bending means in a retracting direction away from the die and maintaining said smooth face of the lead bending means in contact with said roller means.

* * * * *